(12) United States Patent
Sato (10) Patent No.: US 11,705,400 B2
(45) Date of Patent: Jul. 18, 2023

(54) SEMICONDUCTOR PACKAGE

(71) Applicant: SHINKO ELECTRIC INDUSTRIES CO., LTD., Nagano (JP)

(72) Inventor: Seiji Sato, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 14 days.

(21) Appl. No.: 16/699,265

(22) Filed: Nov. 29, 2019

(65) Prior Publication Data

US 2020/0185326 A1 Jun. 11, 2020

(30) Foreign Application Priority Data

Dec. 10, 2018 (JP) .................................. 2018-231106

(51) Int. Cl.
*H01L 23/538* (2006.01)
*H01L 23/29* (2006.01)
*H01L 23/31* (2006.01)

(52) U.S. Cl.
CPC ........ *H01L 23/5383* (2013.01); *H01L 23/293* (2013.01); *H01L 23/3114* (2013.01); *H01L 23/3121* (2013.01); *H01L 23/3142* (2013.01)

(58) Field of Classification Search
CPC ............. H01L 23/5383; H01L 23/3142; H01L 23/3121; H01L 21/56
See application file for complete search history.

(56) References Cited

U.S. PATENT DOCUMENTS

| | | | | |
|---|---|---|---|---|
| 7,989,707 B2 | 8/2011 | Yamano et al. | | |
| 8,304,296 B2 * | 11/2012 | Ko | ........................ | H01L 25/105 257/738 |
| 9,137,900 B2 * | 9/2015 | Tanaka | ................... | H05K 1/185 |
| 9,620,484 B2 * | 4/2017 | Kim | ..................... | H01L 25/0657 |
| 9,947,642 B2 * | 4/2018 | Kumar | .................. | H01L 25/105 |
| 10,229,859 B2 * | 3/2019 | Wang | ...................... | H01L 25/50 |
| 10,475,749 B2 * | 11/2019 | Kim | ...................... | H01L 23/544 |
| 10,622,340 B2 * | 4/2020 | Jeong | .................. | H01L 21/4857 |
| 10,727,175 B2 * | 7/2020 | Matsuzawa | ........... | H01L 21/563 |
| 10,756,075 B2 * | 8/2020 | Hong | .................. | H01L 23/3135 |
| 10,825,774 B2 * | 11/2020 | Oh | ...................... | H01L 23/5386 |
| 11,075,151 B2 * | 7/2021 | Tsai | ...................... | H01L 25/105 |
| 11,133,296 B2 * | 9/2021 | Jeong | .................. | H01L 23/3128 |

FOREIGN PATENT DOCUMENTS

WO 2007/069606 6/2007

* cited by examiner

*Primary Examiner* — Mark W Tornow
*Assistant Examiner* — Abbigale A Boyle
(74) *Attorney, Agent, or Firm* — IPUSA, PLLC (57) ABSTRACT

A semiconductor package includes: a first substrate; a semiconductor chip mounted on the first substrate such that a circuit formation surface is oriented toward the first substrate; a second substrate arranged above the first substrate, the semiconductor chip being sandwiched between the first substrate and the second substrate; and a resin that seals the semiconductor chip and that is filled between the first substrate and the second substrate, wherein the second substrate includes a solder resist layer having a first surface facing a back surface that is an opposite surface of the circuit formation surface of the semiconductor chip, and wherein on an area of the first surface of the solder resist layer facing the back surface of the semiconductor chip, at least one protruding portion that protrudes towards the back surface of the semiconductor chip is provided.

5 Claims, 7 Drawing Sheets

SEMICONDUCTOR PACKAGE

CROSS-REFERENCE TO RELATED APPLICATION

This application is based upon and claims priority to Japanese Patent Application No. 2018-231106, filed on Dec. 10, 2018, the entire contents of which are incorporated herein by reference.

FIELD

The present disclosure relates to a semiconductor package.

BACKGROUND

In recent years, semiconductor packages in which semiconductor chips are embedded are proposed for thinning, space-saving, and the like.

An example of such a semiconductor package can be a structure in which, over a first substrate on which a semiconductor chip is flip-chip mounted in a face-down state, a second substrate is laminated via a substrate connection member such as a solder ball, and resin seals a gap between the first substrate and the second substrate.

For a semiconductor package as described above, for example, a step of preparing a first substrate on which a semiconductor chip is mounted; a step of preparing a second substrate on which a substrate connection member is mounted; a step of laminating the second substrate over the first substrate such that a substrate connection member mounting surface faces a semiconductor chip mounting surface; and a step of filling a resin between the first substrate and the second substrate are included. In the step of filling with the resin, in terms of reliability, it is preferable that the resin is also filled between the back surface of the semiconductor chip and the second substrate.

RELATED-ART DOCUMENTS

Patent Documents

[Patent Document 1] International Publication Pamphlet No. WO 2007/069606

However, due to a need for further thinning of semiconductor packages, the gap between the back surface of the semiconductor chip and the second substrate is required to be narrowed. Moreover, in the process of filling with the resin, because the structure to be filled is pressed from the top and the bottom by a die, the gap described above is further narrowed, and it is difficult to fill the resin between the back surface of the semiconductor chip and the second substrate.

In view of the above, the present invention has an object to provide a semiconductor package having a structure such that a resin is easily filled between a back surface of a semiconductor chip and a substrate facing the back surface.

SUMMARY

According to one aspect, a semiconductor package includes: a first substrate; a semiconductor chip mounted on the first substrate such that a circuit formation surface is oriented toward the first substrate; a second substrate arranged above the first substrate, the semiconductor chip being sandwiched between the first substrate and the second substrate; and a resin that seals the semiconductor chip and that is filled between the first substrate and the second substrate, wherein the second substrate includes a solder resist layer having a first surface facing a back surface that is an opposite surface of the circuit formation surface of the semiconductor chip, and wherein on an area of the first surface of the solder resist layer facing the back surface of the semiconductor chip, at least one protruding portion that protrudes towards the back surface of the semiconductor chip is provided.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

In the following, an embodiment will be described with reference to the accompanying drawings. Note that in these drawings, the same elements are referred to by the same reference numerals, and duplicate descriptions may be omitted as appropriate.

First Embodiment

Structure of Semiconductor Package According to First Embodiment

Figure 1A:
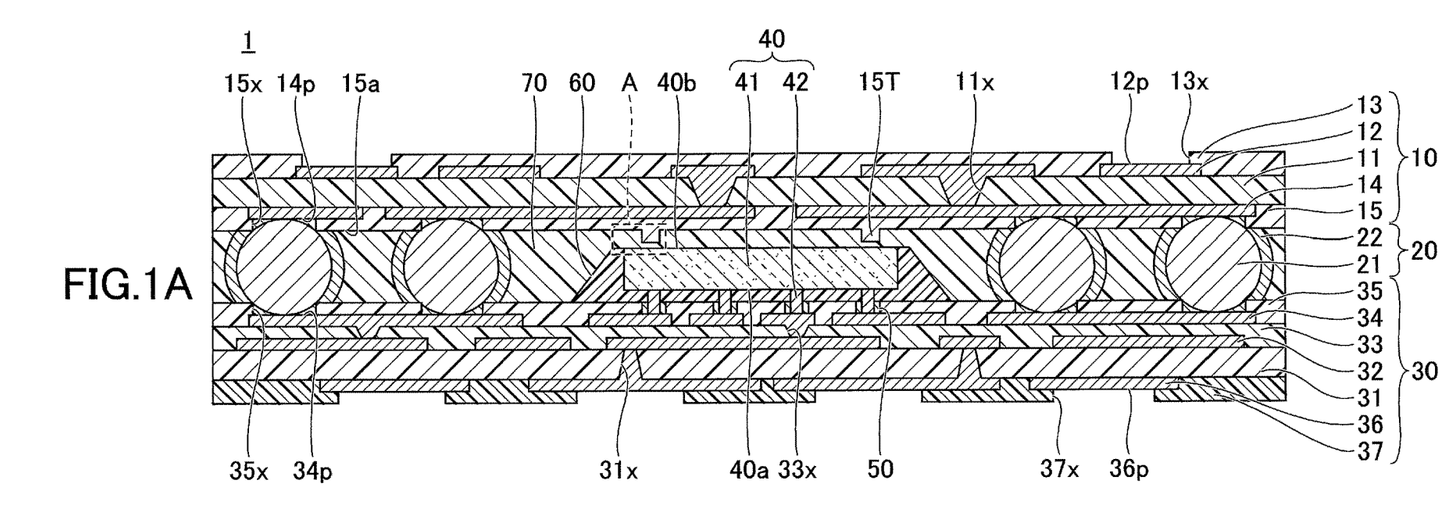
FIGS. 1A and 1B are cross-sectional views illustrating an example of a semiconductor package according to a first embodiment (part 1)
Figure 1B:
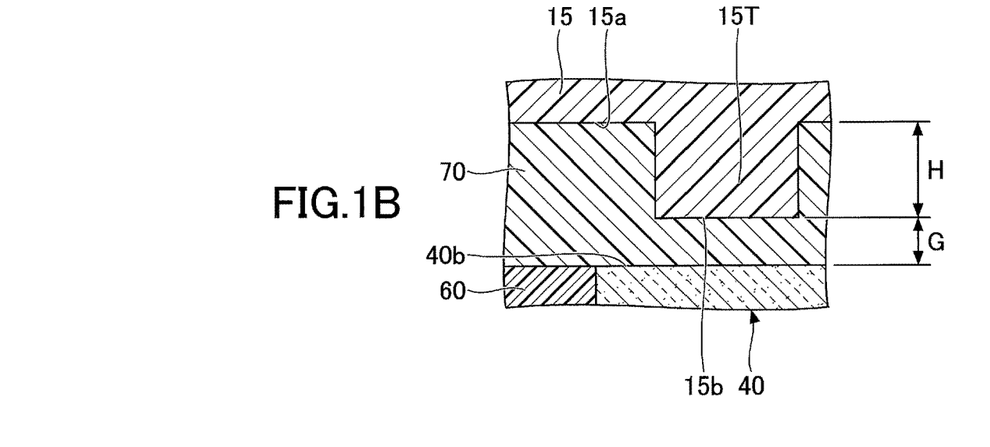

First, a structure of a semiconductor package 1 according to a first embodiment will be described. FIGS. 1A and 1B are cross-sectional views illustrating an example of the semiconductor package 1 according to the first embodiment. FIG. 1A is an overall view, and FIG. 1B is an enlarged view of part A of FIG. 1A.

With reference to FIGS. 1A and 1B, the semiconductor package 1 includes a substrate 10, a substrate connection member 20, a substrate 30, a semiconductor chip 40, joint portions 50, an underfill resin 60, and a mold resin 70. In the semiconductor package 1, the substrate 10 and the substrate 30 are laminated via the substrate connection member 20 that electrically connects the substrate 10 and the substrate 30.

Note that according to the first embodiment, for convenience of description, the solder resist layer 13 side of the semiconductor package 1 is referred to as an upper side or one side, and the solder resist layer 37 side of the semiconductor package 1 is referred to as a lower side or the other side. Also, with respect to each part or element of the semiconductor package 1, a solder resist layer 13 side surface is referred to as one surface or an upper surface, and a solder resist layer 37 side surface is referred to as the other surface or a lower surface. Note that the semiconductor package 1, however, may be used in an inverted position or may be oriented at a desired angle. Also, a plan view refers to a view of an object taken in a direction normal to one surface of the solder resist layer 13, and a planar shape refers to the shape of an object viewed in a direction normal to one surface of the solder resist layer 13.

The substrate 10 is arranged on the substrate 30, between which the semiconductor chip 40 is interposed. The substrate 10 includes an insulating layer 11, a wiring layer 12, a solder resist layer 13, a wiring layer 14, and a solder resist layer 15. The planar shape of the substrate 10 is not particularly limited, but can be, for example, a 15 mm square rectangle.

In the substrate 10, as the insulating layer 11, for example, a glass epoxy substrate in which glass cloth is impregnated with an insulating resin such as an epoxy-based resin or the like can be used. As the insulating layer 11, a substrate in which a nonwoven fabric or a woven fabric such as glass fiber, carbon fiber, or aramid fiber is impregnated with an insulating resin such as an epoxy-based resin or the like may be used. The thickness of the insulating layer 11 can be, for example, in a range of approximately 60 µm to 200 µm. Note that in each drawing, illustration of glass cloth or the like is omitted.

The wiring layer 12 is formed on one side of the insulating layer 11. The wiring layer 12 is electrically connected to the wiring layer 14. The wiring layer 12 includes via wirings filling via holes 11x that penetrate the insulating layer 11 and expose one surface of the wiring layer 14 and include a wiring pattern formed on one surface of the insulating layer 11.

Each of the via holes 11x can be a recessed portion having an inverted truncated cone shape in which the diameter of the opening portion opened on the solder resist layer 13 side is larger than the diameter of the bottom surface of the opening portion formed by the upper surface of the wiring layer 14. The diameter of the opening portion of each of the via holes 11x can be, for example, approximately 50 µm. As a material of the wiring layer 12, for example, copper (Cu) or the like can be used. For example, the thickness of the wiring pattern constituting the wiring layer 12 can be in a range of approximately 10 µm to 20 µm.

The solder resist layer 13 is formed on one side of the insulating layer 11 so as to cover the wiring layer 12. The solder resist layer 13 can be formed of, for example, a photosensitive resin or the like. The thickness of the solder resist layer 13 can be, for example, in a range of 15 µm to 35 µm. The solder resist layer 13 has opening portions 13x, and a portion of the wiring layer 12 is exposed within each of the opening portions 13x. The wiring layer 12, which is exposed within the opening portions 13x, includes pads 12p. The pads 12p function as pads that are electrically connected to an electronic component such as a semiconductor chip or a semiconductor package (not illustrated).

As needed, a metal layer may be formed on one surface of the pads 12p and an antioxidant treatment, such as an OSP (Organic Solderability Preservative) treatment, may be applied. Examples of the metal layer include an Au layer, a Ni/Au layer (a metal layer made by laminating a Ni layer and an Au layer in this order), a Ni/Pd/Au layer (a metal layer made by laminating a Ni layer, a Pd layer, and an Au layer in this order), and the like. Also, on one surface of the pads 12p, external connection terminals such as solder balls may be formed.

The wiring layer 14 is formed on the other surface of the insulating layer 11. One surface of the wiring layer 14 is in contact with lower ends of the via wirings filling the via holes 11x of the wiring layer 12 to be conductive. The material and the thickness of the wiring layer 14 can be, for example, similar to those of the wiring pattern constituting the wiring layer 12.

The solder resist layer 15 is formed on the other surface of the insulating layer 11 so as to cover the wiring layer 14. The material and the thickness of the solder resist layer 15 can be, for example, similar to those of the solder resist layer 13. The solder resist layer 15 has opening portions 15x, and a portion of the wiring layer 14 is exposed within each of the opening portions 15x. The wiring layer 14, which is exposed within the opening portions 15x, includes pads 14p. The pads 14p function as pads that are electrically connected to the substrate connection member 20.

As needed, on the other surface of the pads 14p, a metal layer may be formed and an antioxidant treatment, such as an OSP (Organic Solderability Preservative) treatment, may be applied.

The solder resist layer 15 has a lower surface 15a facing a back surface 40b that is the opposite surface of a circuit formation surface 40a of the semiconductor chip 40. Between the lower surface 15a of the solder resist layer 15 and the back surface 40b of the semiconductor chip 40, the mold resin 70 is filled.

On an area of the lower surface 15a of the solder resist layer 15 facing the back surface 40b of the semiconductor chip 40, protruding portions 15T protruding toward the back surface 40b of the semiconductor chip 40 are provided. The solder resist layer 15 and the protruding portions 15T can be configured, for example, in a two-layer structure. The height H of the protruding portions 15T (the amount of protrusion from the lower surface 15a of the solder resist layer 15) can be, for example, in a range of approximately 15 µm to 20 µm. In the example of FIGS. 1A and 1B, a gap is formed between end surfaces 15b of the protruding portions 15T and the back surface 40b of the semiconductor chip 40, and the gap is filled with mold resin 70. The size G of the gap can be, for example, in a range of approximately 5 µm to 10 µm.

Figure 2:
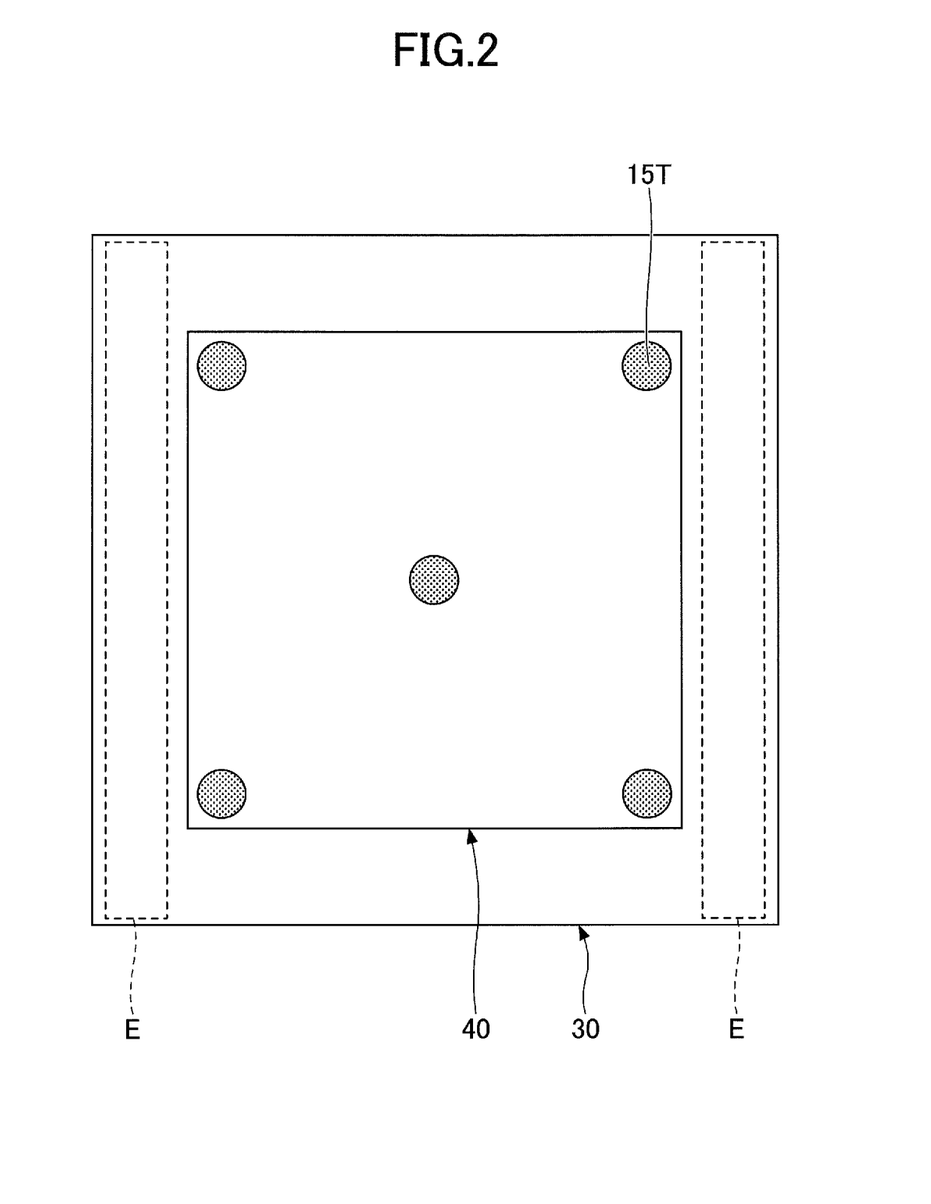
FIG. 2 is a schematic plan view that describes an arrangement of protruding portions (part 1)

A plurality of protruding portions 15T can be provided in an area overlapping the semiconductor chip 40 of the solder resist layer 15 in plan view, as illustrated in FIG. 2, for example. In the example of FIG. 2, one protruding portion 15T is provided, on the lower surface 15a of the solder resist layer 15, at a position overlapping the central portion of the semiconductor chip 40 in plan view. Also, four protruding portions 15T are provided, on the lower surface 15a of the solder resist layer 15, at positions overlapping the four corners of the semiconductor chip 40 in plan view. Note that in a case where the planar shape of the semiconductor chip 40 is a rectangular shape, the central portion of the semiconductor chip 40 is a portion including an intersection of diagonal lines of the rectangular semiconductor chip 40.

The planar shape of the protruding portions 15T can be a circular shape, for example. For example, when the semiconductor chip 40 has a 12 mm square rectangular shape, the protruding portions 15T having, as a planar shape, a circular shape of a diameter of approximately 1 mm can be arranged at the positions of FIG. 2. In a case where the planar shape of the protruding portions 15T are a circular shape, the shape of the protruding portions 15T may be a cylindrical shape, or may be a truncated cone shape, which reduces in diameter toward the back surface 40b of the semiconductor chip 40. Note that the planar shape of the protruding portions 15T, the positions at which the protruding portions 15T are arranged, and the number of protruding portions 15T are not limited to the configuration illustrated in FIG. 2, but can be determined as desired.

Note that FIG. 2 is a schematic plan view that describes an arrangement of the protruding portions 15T, and schematically illustrates a partial configuration of the semiconductor package 1. The dimensional relationship of FIG. 2 does not match the dimensional relationship of FIGS. 1A and 1B. Also, in FIG. 2, E indicates areas where the substrate connection members 20 are arranged.

Referring back to FIGS. 1A and 1B, the substrate 30 includes an insulating layer 31, a wiring layer 32, an insulating layer 33, a wiring layer 34, a solder resist layer 35, a wiring layer 36, and a solder resist layer 37. The planar shape of the substrate 30 is not particularly limited, but can be, for example, a 15 mm square rectangle.

In the substrate 30, the material and the thickness of the insulating layer 31 can be, for example, similar to those of the insulating layer 11. The wiring layer 32 is formed on one side of the insulating layer 31. The material and the thickness of the wiring layer 32 can be, for example, similar to those of the wiring pattern constituting the wiring layer 12.

The insulating layer 33 is formed on one surface of the insulating layer 31 so as to cover the wiring layer 32. For example, the insulating layer 33 can be made of an insulating resin such as a thermosetting epoxy-based resin. Also, the insulating layer 32 may include a filler such as silica ($SiO_2$). The thickness of the insulating layer 33 can be, for example, in a range of 15 μm to 35 μm.

The wiring layer 34 is formed on one side of the insulating layer 33. The wiring layer 34 includes via wirings filling via holes 33x that penetrate the insulating layer 33 and expose one surface of the wiring layer 32 and include a wiring pattern formed on one surface of the insulating layer 33.

Each of the via holes 33x can be a recessed portion having an inverted truncated cone shape in which the area of the opening portion that is opened on the solder resist layer 35 side is larger than the area of the bottom surface formed by one surface of the wiring layer 32. The material of the wiring layer 34 and the thickness of the wiring pattern constituting the wiring layer 34 can be, for example, similar to those of the wiring layer 12.

The solder resist layer 35 is formed on one surface of the insulating layer 33 so as to cover the wiring layer 34. The material and the thickness of the solder resist layer 35 can be, for example, similar to those of the solder resist layer 13. The solder resist layer 35 has opening portions 35x, and a portion of the wiring layer 34 is exposed within each of the opening portions 35x. The wiring layer 34, which is exposed within the opening portions 35x, includes pads 34p.

Some of the pads 34p function as pads that are electrically connected to the substrate connection members 20. Others of the pads 34p function as pads that are electrically connected to the semiconductor chip 40. Note that the opening diameter of the pads 34p that are electrically connected to the substrate connecting members and the opening diameter of the pads 34p that are electrically connected to the semiconductor chip 40 can be set independently.

As needed, on one surface of the pads 34p, a metal layer as described above may be formed and an antioxidant treatment, such as an OSP treatment, may be applied.

The wiring layer 36 is formed on the other side of the insulating layer 31. The wiring layer 36 includes via wirings filling via holes 31x that penetrate the insulating layer 31 and expose the other surface of the wiring layer 32 and include a wiring pattern formed on the other surface of the insulating layer 31.

Each of the via holes 31x can be a recessed portion having a truncated cone shape in which the area of the opening portion that is opened on the solder resist layer 37 side is larger than the area of the bottom surface formed by the other surface of the wiring layer 32. The upper end portions of the via wirings filling the via holes 31x of the wiring layer 36 are in contact with the other surface of the wiring layer 32 to be conductive. The material of the wiring layer 36 and the thickness of the wiring pattern constituting the wiring layer 36 can be, for example, similar to those of the wiring layer 12.

The solder resist layer 37 is formed on the other surface of the insulating layer 31 so as to cover the wiring layer 36. The material and the thickness of the solder resist layer 37 can be similar to, for example, those of the solder resist layer 13. The solder resist layer 37 has opening portions 37x, and a portion of the wiring layer 36 is exposed within each of the opening portions 37x. The wiring layer 36, which is exposed within the opening portions 37x, includes pads 36p. The pads 36p function as pads that are electrically connected to a mounting board such as a motherboard (not illustrated). On the other surface of the pads 36p, external connection terminals such as solder balls may be formed.

As needed, on the other surface of the pads 36p, a metal layer as described above may be formed and an antioxidant treatment, such as an OSP treatment, may be applied.

On one surface of the substrate 30, the semiconductor chip 40 is flip-chip mounted in a face-down state (such that the circuit formation surface 40a is oriented toward one surface of the substrate 30). More specifically, the semiconductor chip 40 includes a chip body 41 including a semiconductor integrated circuit and protruding electrodes 42 that are connection terminals. The protruding electrodes 42 of the semiconductor chip 40 are electrically connected via the joint portions 50 to the pads 34p of the substrate 30. For example, a gold bump, a copper post, or the like can be used as protruding electrodes 42. As the joint portions 50, for example, a solder material such as an alloy containing Pb, an alloy of Sn and Cu, an alloy of Sn and Sb, an alloy of Sn and Ag, or an alloy of Sn and Ag and Cu can be used.

The underfill resin 60 is filled between the circuit formation surface 40a of the semiconductor chip 40 and one surface of the substrate 30, and the underfill resin 60 also extends to each side surface of the semiconductor chip 40. The back surface 40b of the semiconductor chip 40 is exposed from the underfill resin 60.

In other words, the circuit formation surface 40a and the side surfaces of the semiconductor chip 40 are continuously coated by the underfill resin 60. The underfill resin 60 can be made of an insulating resin such as, for example, a thermosetting epoxy-based resin. The underfill resin 60 may contain filler such as silica ($SiO_2$). The planar shape of the semiconductor chip 40 is not particularly limited, but can be, for example, a 12 mm square rectangle.

The substrate connection members 20 are arranged between the pads 14p of the substrate 10 and the pads 34p of the substrate 30. The substrate connection members 20 electrically connect the substrate 10 to the substrate 30 and provide a function to ensure a predetermined interval between the substrate 10 and the substrate 30.

According to the present embodiment, for example, a solder ball with a core is used as each of the substrate connection members 20. Each of the substrate connection members 20 includes a generally spherical core 21 and a conductive material 22 covering the outer peripheral surface of the core 21, and the cores 21 are arranged to be in contact with the pads 14p and 34p.

As the cores 21, for example, a metal core made of a metal such as copper or a resin core made of resin can be used. As the conductive materials 22, for example, a solder material such as an alloy containing Pb, an alloy of Sn and Cu, an alloy of Sn and Sb, an alloy of Sn and Ag, or an alloy of Sn, Ag, and Cu can be used. The diameter of the cores 21 can be appropriately determined in consideration of the height (thickness) of the semiconductor chip 40. For example, the diameter of the cores 21 can be approximately 180 µm, the thickness of the conductive materials 22 can be approximately 20 µm, and the total diameter of the substrate connection members 20 can be approximately 220 µm.

Note that although the substrate connection members 20 are arranged on two lines for each of left and right with respect to the semiconductor chip 40 in FIG. 2, the substrate connection members 20 are not limited to this arrangement, and the substrate connection members 20 may be arranged on three or more lines for each of left and right with respect to the semiconductor chip 40. The substrate connection members 20 may also be arranged on the periphery of the substrate 10 in a peripheral arrangement. For example, in a case where the diameter of the substrate connection members 20 is approximately 200 µm, the pitch of the substrate connection members 20 can be approximately 270 µm.

The mold resin 70 seals the substrate connection members 20, the semiconductor chip 40, and the underfill resin 60, and is filled between the respective surfaces of the substrate 10 and the substrate 30 facing each other. As the mold resin 70, for example, an insulating resin such as a thermosetting epoxy-based resin containing a filler can be used.

Method of Manufacturing Semiconductor Package According to First Embodiment

Figure 3A:
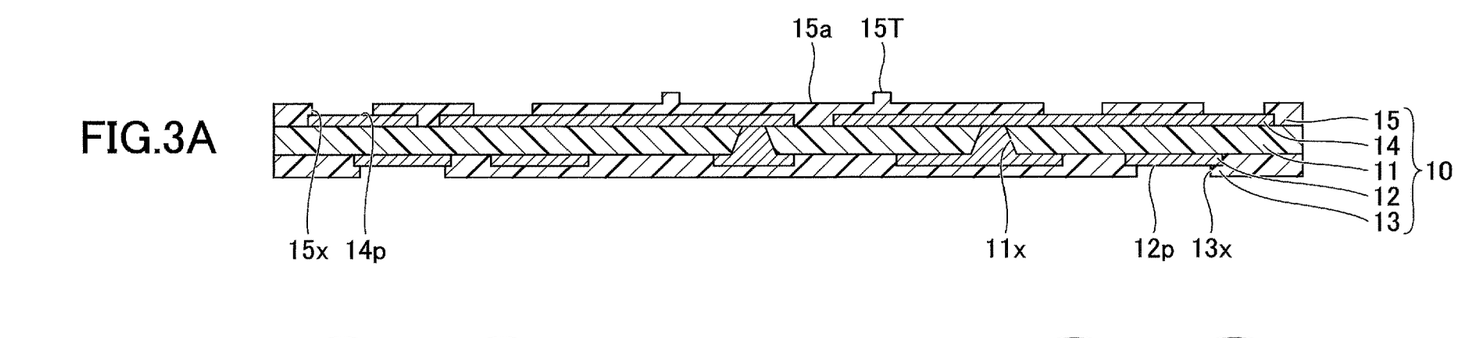
FIGS. 3A to 3C are diagrams illustrating an example of steps of manufacturing the semiconductor package according to the first embodiment (part 1)
Figure 3B:
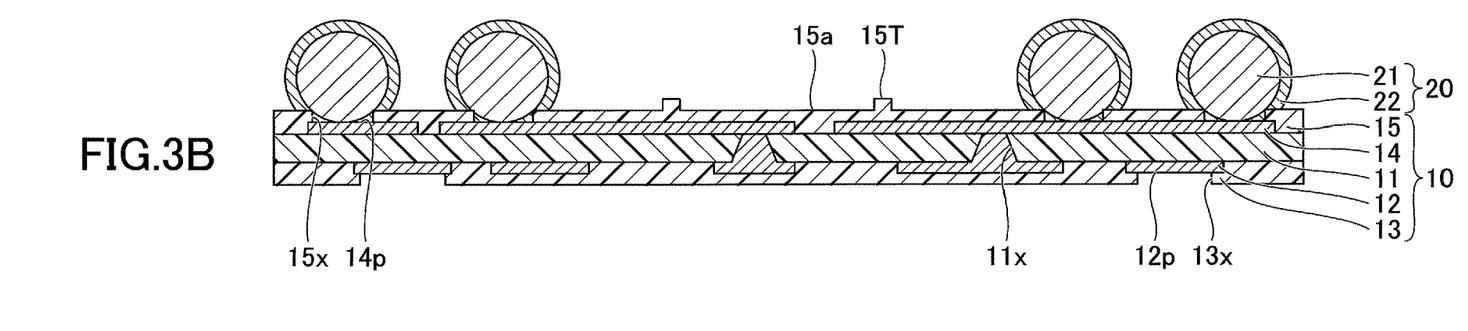
Figure 3C:
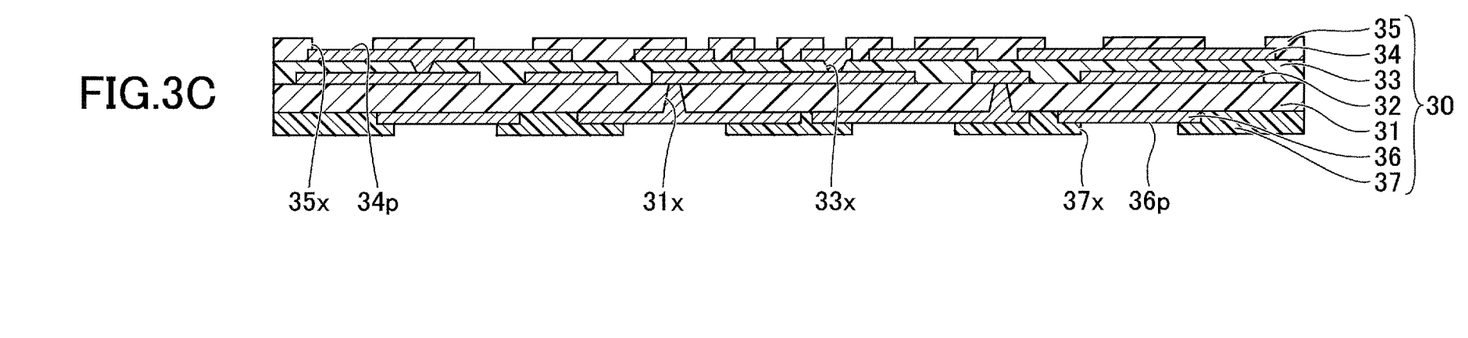
Figure 4A:
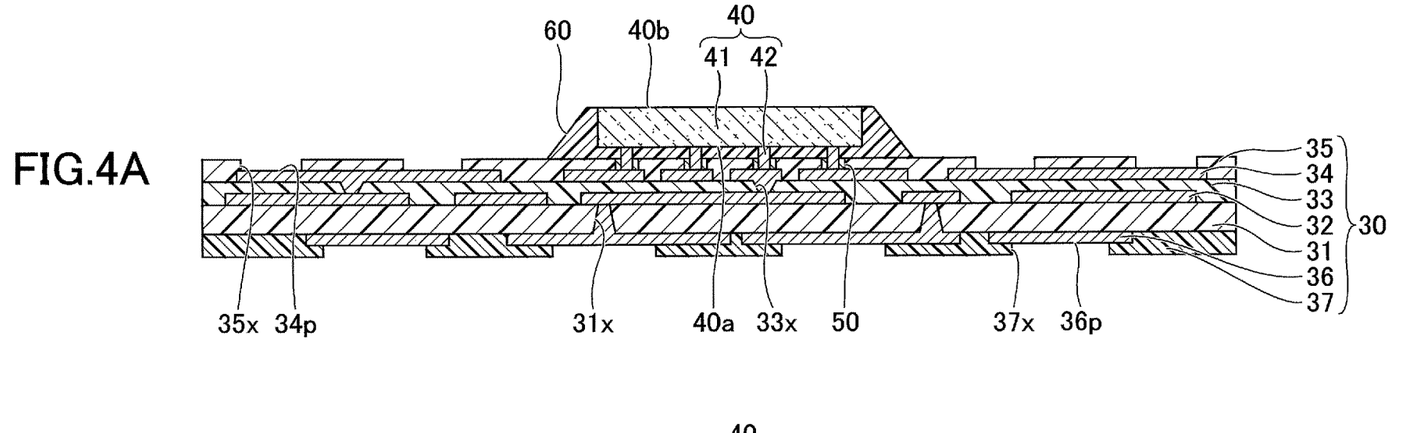
FIGS. 4A and 4B are diagrams illustrating an example of steps of manufacturing the semiconductor package according to the first embodiment (part 2)
Figure 4B:
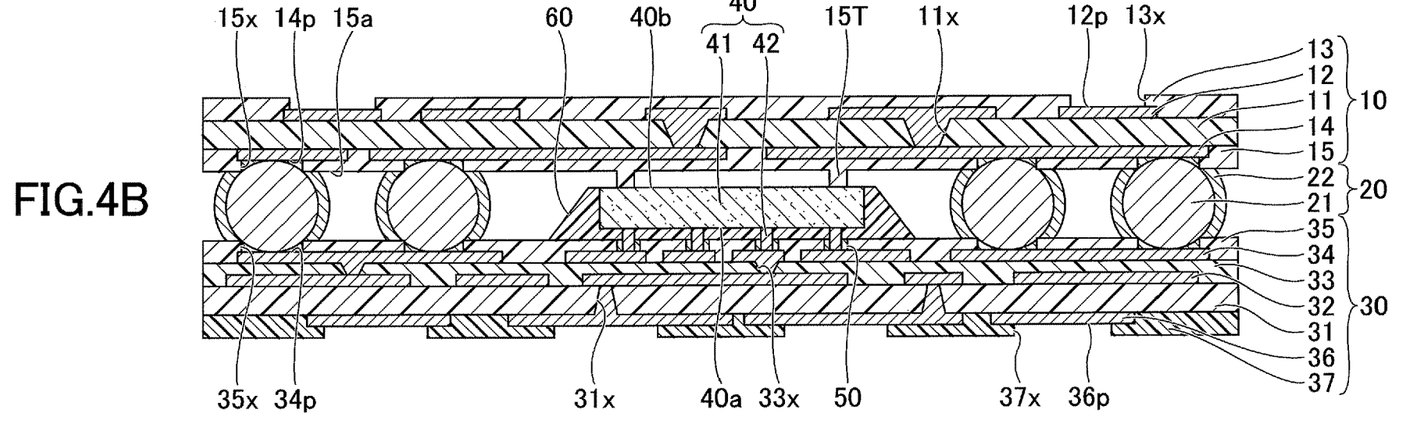
Figure 5A:
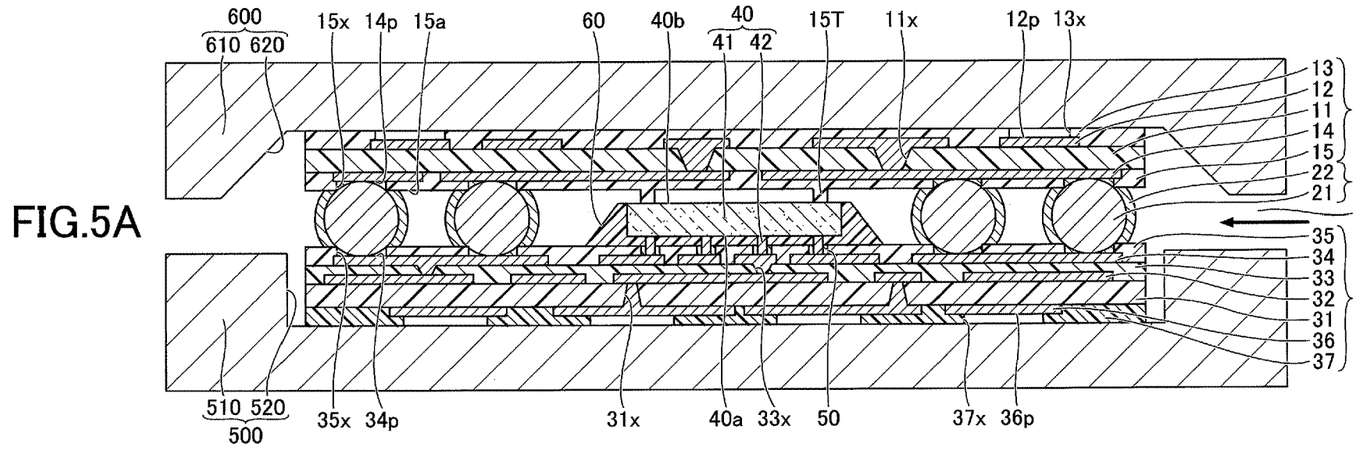
FIGS. 5A and 5B are diagrams illustrating an example of steps of manufacturing the semiconductor package according to the first embodiment (part 3)
Figure 5B:
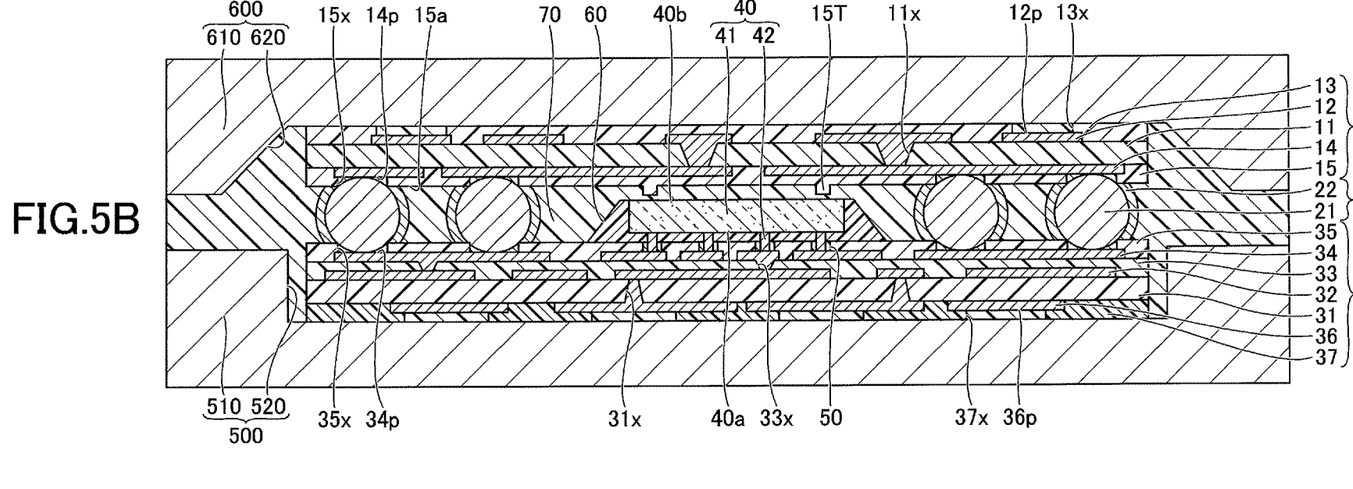

Next, a method of manufacturing the semiconductor package 1 according to the first embodiment will be described. FIGS. 3 to 5 are diagrams illustrating an example of steps of manufacturing the semiconductor package 1 according to the first embodiment. Note that although only a portion to form the semiconductor package 1 is illustrated to describe each step here, in practice, a plurality of portions to form semiconductor packages are prepared, and then these are separated to form a plurality of semiconductor packages.

First, in the step illustrated in FIG. 3A, the substrate 10 is prepared. Specifically, as described above, the insulating layer 11 using a glass epoxy substrate or the like is prepared, and the wiring layer 14 is formed on the other surface of the insulating layer 11. Next, the via holes 11x are formed in the insulating layer 11 to expose one surface of the wiring layer 14, and the wiring layer 12 is further formed on one surface of the insulating layer 11. The wiring layer 12 and wiring layer 14 are electrically connected.

After forming the via holes 11x, it is preferable to perform a desmear treatment to remove resin residue adhering to the surface of the wiring layer 14 that is exposed to the bottom surface of the via holes 11x. The via holes 11x can be formed, for example, by a laser processing method using a $CO_2$ laser or the like. The wiring layers 12 and 14 can be formed by using various wiring forming methods, such as a semi-additive method or a subtractive method. For example, the wiring layers 12 and 14 can be formed by copper plating or the like.

Next, the solder resist layer 13 is formed on one surface of the insulating layer 11 to cover the wiring layer 12, and the solder resist layer 15 is formed on the other side of the insulating layer 11 to cover the wiring layer 14. The solder resist layer 13 can be formed, for example, by applying an insulating resin, such as a liquid or paste-like photosensitive epoxy-based resin, to one surface of the insulating layer 11 to coat the wiring layer 12 by a screen printing method, a roll coating method, or a spin coating method.

Similarly, the solder resist layer 15 can be formed by applying an insulating resin, such as a liquid or paste-like photosensitive epoxy-based resin, to the other surface of the insulating layer 11 to coat the wiring layer 14 in a similar manner. Alternatively, instead of applying a liquid or paste-like photosensitive resin, for example, an insulating resin, such as a film-like photosensitive epoxy-based resin may be laminated.

Then, by exposing and developing the applied or laminated insulating resin, the opening portions 13x and 15x are formed in the solder resist layers 13 and 15, and the pads 12p and 14p are formed (photolithography). Note that the opening portions 13x and 15x may be formed by a laser processing method or a blasting process. The planar shape of each of the opening portions 13x and 15x can be, for example, a circular shape. The respective diameters of the opening portions 13x and 15x, respectively, can be designed as suited in accordance with an object to be connected.

Then, the protruding portions 15T are formed on the upper surface of the solder resist layer 15. The solder resist layer 15 and the protruding portions T can be formed of a same material. Specifically, similar to the solder resist layer 15, the protruding portions 15T can be formed by applying a liquid or paste-like photosensitive insulating resin or by laminating a film-like photosensitive insulating resin, and then exposing and developing the applied or laminated insulating resin. In particular, because the accuracy of the thickness of a film-like insulating resin is high, to form the protruding portions 15T from the film-like insulating resin is preferable in terms of being able to enhancing the accuracy of the height of the protruding portion 15T. That is, using a film-like insulating resin makes it easier to make the height of the protruding portions 15T close to a desired value.

Next, in the step illustrated in FIG. 3B, the substrate connection members 20 are placed on the pads 14p that are exposed in the opening portions 15x of the solder resist layer 15 of the substrate 10. Then, by heating to a predetermined temperature, the conductive materials 22 constituting the substrate connection members 20 are melt, and thereafter hardened and joined to the pads 14p.

Next, in the step illustrated in FIG. 3C, the substrate 30 is prepared. Specifically, as described above, the insulating layer 31 using a glass epoxy substrate or the like as described above is prepared, and the wiring layer 32 is formed on one surface of the insulating layer 31. Next, the via holes 31x that exposes the other surface of the wiring layer 32 are formed on the insulating layer 31, and the wiring layer 36 is further formed on the other surface of the insulating layer 31. The wiring layer 32 and the wiring layer 36 are electrically connected via the insulating layer 31.

After forming the via holes 31x, it is preferable to perform a desmear treatment to remove resin residue adhering to the surface of the wiring layer 32 that is exposed to the bottom portion of the via holes 31x. The via holes 31x can be formed, for example, by a laser processing method using a $CO_2$ laser or the like. The wiring layers 32 and 36 can be formed by using various wiring forming methods, such as a semi-additive method or a subtractive method.

Next, the insulating layer 33 is formed by laminating an insulating resin film such as a thermosetting epoxy-based resin on one surface of the insulating layer 31 so as to cover the wiring layer 32. Alternatively, instead of laminating an insulating resin film such as a thermosetting epoxy-based resin, an insulating resin, such as a liquid or paste-like thermosetting epoxy-based resin, may be applied and then hardened to form the insulating layer 33.

Next, the via holes 33x that penetrate the insulating layer 33 and expose one surface of the wiring layer 32 are formed on the insulating layer 33. The via holes 33x can be formed, for example, by a laser processing method using a $CO_2$ laser or the like. After forming the via holes 33x, it is preferable to perform a desmear treatment to remove resin residue adhering to the surface of the wiring layer 32 that is exposed to the bottom portion of the via holes 31x.

Next, the wiring layer 34 is foamed on one side of the insulating layer 33. The wiring layer 34 includes the via wirings filling the via holes 33x and the wiring pattern foamed on one surface of the insulating layer 33. The wiring layer 34 is electrically connected to the wiring layer 32 exposed at the bottom portions of the via holes 33x. The wiring layer 34 can be formed by using various wiring forming methods, such as a semi-additive method or a subtractive method.

Next, similarly to the solder resist layer 13 and the like of the substrate 10, the solder resist layer that covers the wiring layer 34 is formed on one surface of the insulating layer 33, and the solder resist layer 37 that covers the wiring layer 36 is formed on the other surface of the insulating layer 31. Then, similarly to the opening portions 13x and the like of the substrate 10, the opening portions 35x and 37x are formed in the solder resist layers 35 and 37 and the pads 34p and 36p are formed (photolithography). Thereby, the substrate 30 is completed.

Next; in the step illustrated in FIG. 4A, the semiconductor chip 40 is flip-chip mounted on one surface of the substrate 30 in a face-down state. Specifically, among the pads 34p of the substrate 30, the joint portions 50 are first formed at portions to be connected to the semiconductor chip 40. For example, the joint portions 50 can be formed on the pads 34p by applying a paste-like solder material and reflow.

Next, on one surface of the substrate 30, the underfill resin 60 is attached (laminated) to cover the joint portions 50. As the underfill resin 60, for example, an insulating resin such as a film-like thermosetting epoxy-based resin can be used. At this time point, the underfill resin 60 is in a semi-hardened state (B-stage state).

Next, the semiconductor chip 40 on which the protruding electrodes 42 are formed on the circuit formation surface 40a side of the chip body 41 having a semiconductor integrated circuit is prepared. In a state in which the semiconductor chip 40 is mounted on a pick-up jig and the joint portions 50 and the underfill resin 60 are heated to a predetermined temperature, the semiconductor chip 40 is press-fitted from above the underfill resin 60 so that the tip portions of the protruding electrodes 42 contact one surface of the pads 34p via the molten joint potions 50.

Next, after the joint portions 50 and the underfill resin 60 harden, the pick-up jig is detached from the semiconductor chip 40. Thereby, the protruding electrodes 42 of the semiconductor chip 40 are electrically connected via the joint portions 50 to the pads 34p of the substrate 30. Also, the underfill resin 60 is filled between the circuit formation surface 40a of the semiconductor chip 40 and one surface of the substrate 30, and the underfill resin 60 extends to each side surface of the semiconductor chip 40. In other words, the underfill resin 60 is molded to expose the back surface 40b of the semiconductor chip 40 and to cover the circuit formation surface 40a and the side surfaces. The back surface 40b of the semiconductor chip 40 and the upper surface of the underfill resin 60, which covers the side surfaces of the semiconductor chip 40, can be, for example, on a same plane.

Note that, instead of the step of using a film-like resin, a liquid resin may be used to form the underfill resin 60. In this case, after the semiconductor chip 40 is flip-chip mounted on one surface of the substrate 30, a liquid resin can be poured into and cured between the circuit formation surface 40a of the semiconductor chip 40 and one surface of the substrate 30 to form the underfill resin 60.

Next, in the step illustrated in FIG. 4B, the substrate 10, on which the substrate connection members 20 are mounted, prepared in the step illustrated in FIG. 3B is prepared. Then, the substrate 10 is vertically inverted from the state of FIG. 3B and stacked above the substrate 30 so that the conductive materials 22 of the substrate connection members 20 mounted on the substrate 10 are in contact with one surface of the pads 34p.

The substrate 10 is pressed toward the substrate 30 while the conductive materials 22 are heated. Thereby, the substrate connection members 20 contact the pads 14p of the substrate 10 and the pads 34p of the substrate 30, and the substrate 10 and the substrate 30 are electrically connected via the substrate connection members 20. Also, by the cores 21 of the substrate connection members 20, a predetermined interval between the substrate 10 and the substrate 30 is ensured.

Also, the end surfaces of the respective protruding portions 15T contact the back surface 40b of the semiconductor chip 40. The interval between the lower surface 15a of the solder resist layer 15 and the back surface 40b of the semiconductor chip 40 becomes equal to the height of the protruding portions 15T. The interval between the lower surface 15a of the solder resist layer 15 and the back surface 40b of the semiconductor chip 40 can be, for example, in a range of approximately 15 µm to 20 µm.

Next, in the steps illustrated in FIGS. 5A and 5B, the mold resin 70 is filled between the substrate 10 and the substrate 30 so as to seal the substrate connection members 20, the semiconductor chip 40, and the underfill resin 60. As the mold resin 70, for example, an insulating resin such as a thermosetting epoxy-based resin containing a filler can be used. The mold resin 70 can be formed, for example, by a transfer mold method using a sealing mold.

Specifically, as illustrated in FIG. 5A, the structure illustrated in FIG. 4B is first sandwiched by a lower die 500 having a frame portion 510 and a cavity portion 520 and an upper die 600 having a frame portion 610 and a cavity portion 620. At this time, in a state in which the lower surface of the solder resist layer 37 is in contact with the bottom surface of the cavity portion 520 and the upper surface of the solder resist layer 13 is in contact with the bottom surface of the cavity portion 620, the structure illustrated in FIG. 4B is held between the lower die 500 and the upper die 600.

Note that on an interior wall of the cavity portion 520 and/or 620, a release film may be provided. By providing the release film, it is possible to prevent the mold resin 70 from directly contacting the interior wall of the cavity portion 520 and/or 620. As the release film, a heat resistant material that can withstand a heat temperature of the mold resin 70 and that is easily peeled away from the interior wall of the cavity portion 520 and/or 620 can be used. It is also preferable that the release film has flexibility and extensibility to easily deform in accordance with the shape of the interior wall of the cavity portion 520 and/or 620. Specifically, as the release film, for example, PTFE, ETFE, PET, a FEP film, fluorine-impregnated glass cloth, a polypropylene film, polyvinylidine chloride, or the like can be used.

Then, from a resin inlet 700 illustrated in FIG. 5A, a liquid insulating resin that becomes the mold resin 70 is injected into the cavity portions 520 and 620 in the arrow direction, and as illustrated in FIG. 5B, the cavity portions 520 and 620 are filled with the liquid insulating resin and then the liquid insulating resin is hardened. Thereby, between the substrate 10 and the substrate 30, the mold resin 70 that seals the substrate connection members 20, the semiconductor chip 40, and the underfill resin 60 is formed.

As described above, in practice, a plurality of portions to form a plurality of semiconductor packages are prepared and subsequently separated to manufacture the plurality of semiconductor packages. That is, in the step of FIG. 5B, the mold resin 70 is simultaneously formed in a plurality of portions to form semiconductor packages. After the mold resin 70 is formed, by separating the plurality of portions to form the semiconductor packages, the semiconductor package 1 as illustrated in FIG. 1A is completed.

Note that in the step of FIG. 5B, due to an injection pressure of the insulating resin, a force is applied in directions of extending the interval between the substrate 10 and the substrate 30. Therefore, depending on the height of the protruding portions 15T and the magnitude of the injection pressure of the insulating resin, a gap is generated between the end surfaces of the protruding portions 15T and the back surface 40b of the semiconductor chip 40, and the gap is also filled with the mold resin 70. Also, in a case where a'release film is provided on an interior wall of the cavity portion 520 and/or 620, due to deformation (contraction) of the release film, a gap may be generated between the end surfaces of the protruding portions 15T and the back surface 40b of the semiconductor chip 40.

By filling the gap between the end surfaces of the protruding portions 15T and the back surface 40b of the semiconductor chip 40 with the mold resin 70, the protruding portions 15T and the semiconductor chip 40 are bonded. Therefore, even in a case where the semiconductor package 1 is used under an environment in which a high-temperature environment and a low-temperature environment are repeated, it is possible to prevent the proximity of the protruding portions 15T from being a starting point of peeling.

However, it is not essential to fill the gap between the end surfaces of the protruding portions 15T and the back surface 40b of the semiconductor chip 40 with the mold resin 70. For example, depending on the height of the protruding portions 15T and the magnitude of the injection pressure of the insulating resin, there may be a case in which a gap between the end surfaces of the protruding portions 15T and the back surface 40b of the semiconductor chip 40 is not filled with the mold resin 70.

Figure 6A:
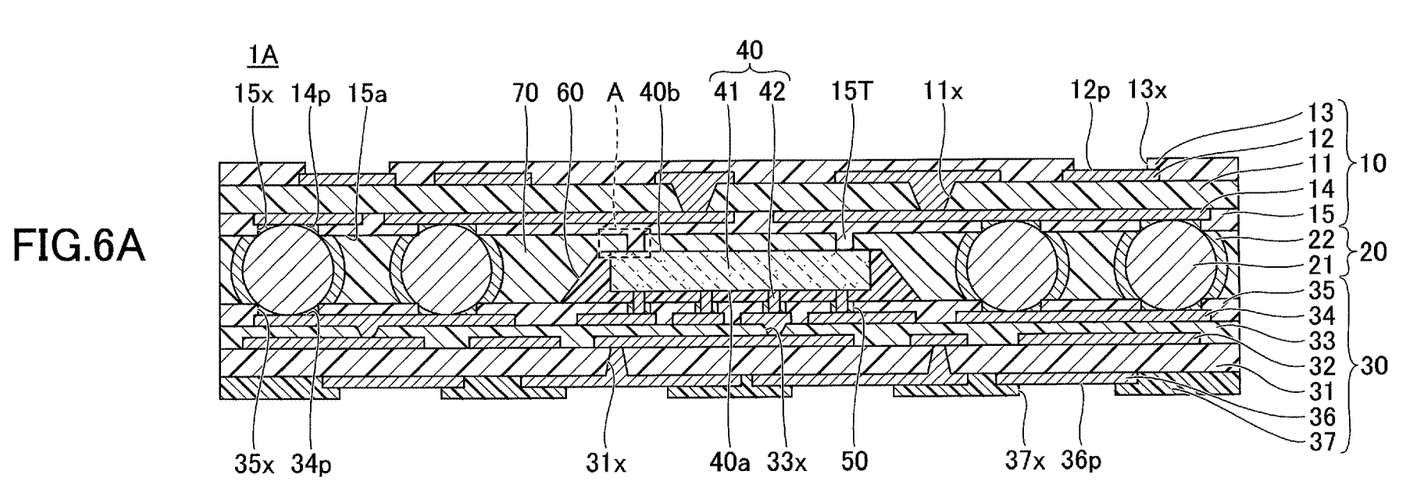
FIGS. 6A and 6B are diagrams illustrating an example of steps of manufacturing a semiconductor package according to the first embodiment (part 2)
Figure 6B:
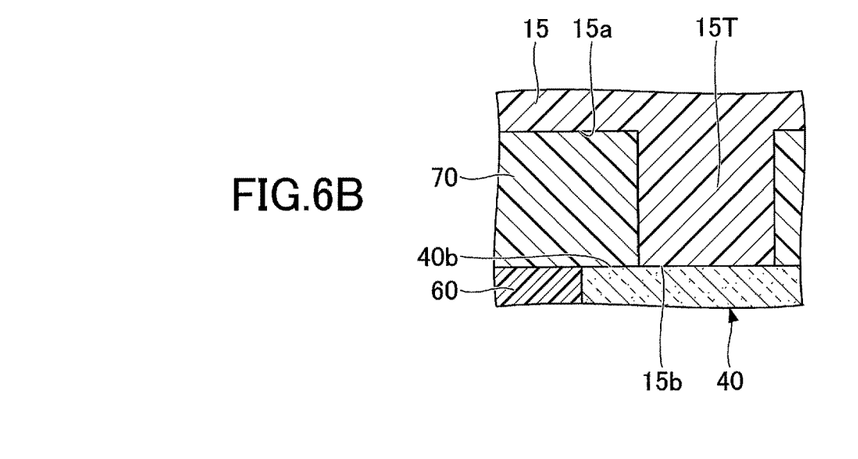

In this case, a semiconductor package 1A has a structure as illustrated in FIGS. 6A and 6B. The semiconductor package 1A differs from the semiconductor package 1 (see FIGS. 1A and 1B) in that the end surfaces 15b of the respective protruding portions 15T are in contact with the back surface 40b of semiconductor chip 40, and the semiconductor package 1A is similar in other respects to the semiconductor package 1.

Note that protruding portions 15T having the end surfaces in contact with the back surface 40b of the semiconductor chip 40 and protruding portions 15T having the end surfaces bonded to the back surface 40b of the semiconductor chip 40 by the mold resin 70 may be mixedly present in one semiconductor package.

As described above, in the semiconductor package 1 according to the first embodiment, on the solder resist layer 15, the protruding portions 15T, which protrude from the lower surface 15a of the solder resist layer 15 toward the back surface 40b of the semiconductor chip 40, are provided. Therefore, at the time of forming the mold resin 70 in the step of FIG. 5B, even in a case where a pressure is applied from the top and bottom of the structure of FIG. 4B that is filled with the mold resin 70, it is possible to secure a gap between the lower surface 15a of the solder resist layer 15 and the back surface 40b of the semiconductor chip 40.

Thereby, it is possible to enhance the performance of injecting the mold resin 70 into the area (space) where the lower surface 15a of the solder resist layer 15 and the back surface 40b of the semiconductor chip 40 face each other. As a result, the area (space) where the lower surface 15a of the solder resist layer 15 and the back surface 40b of the semiconductor chip 40 face each other can be securely filled with the mold resin 70.

Also, because the area (space) where the lower surface 15a of the solder resist layer 15 and the back surface 40b of the semiconductor chip 40 face each other can be securely filled with the mold resin 70, a design value of the gap between the lower surface 15a of the solder resist layer 15 and the back surface 40b of the semiconductor chip 40 can be reduced. Thereby, the total height of the semiconductor package 1 can be reduced.

In particular, in a case where the gap between the end surfaces of the protruding portions 15T and the back surface 40b of the semiconductor chip 40 is filled with the mold resin 70, the protruding portions 15T and the semiconductor chip 40 are bonded. Therefore, for example, even in a case where the semiconductor package 1 is used under an environment in which a high-temperature environment and a low-temperature environment are repeated, it is possible to prevent the proximity of the protruding portions 15T from being a starting point of peeling.

Modified Example 1 of First Embodiment

As a modified example 1 of the first embodiment, an example of a semiconductor package whose arrangement of a protruding portion is different from that of the first embodiment is described. Note that in the modified example 1 of the first embodiment, descriptions of constituent elements that are the same as the previously described embodiment are omitted as appropriate.

Figure 7:
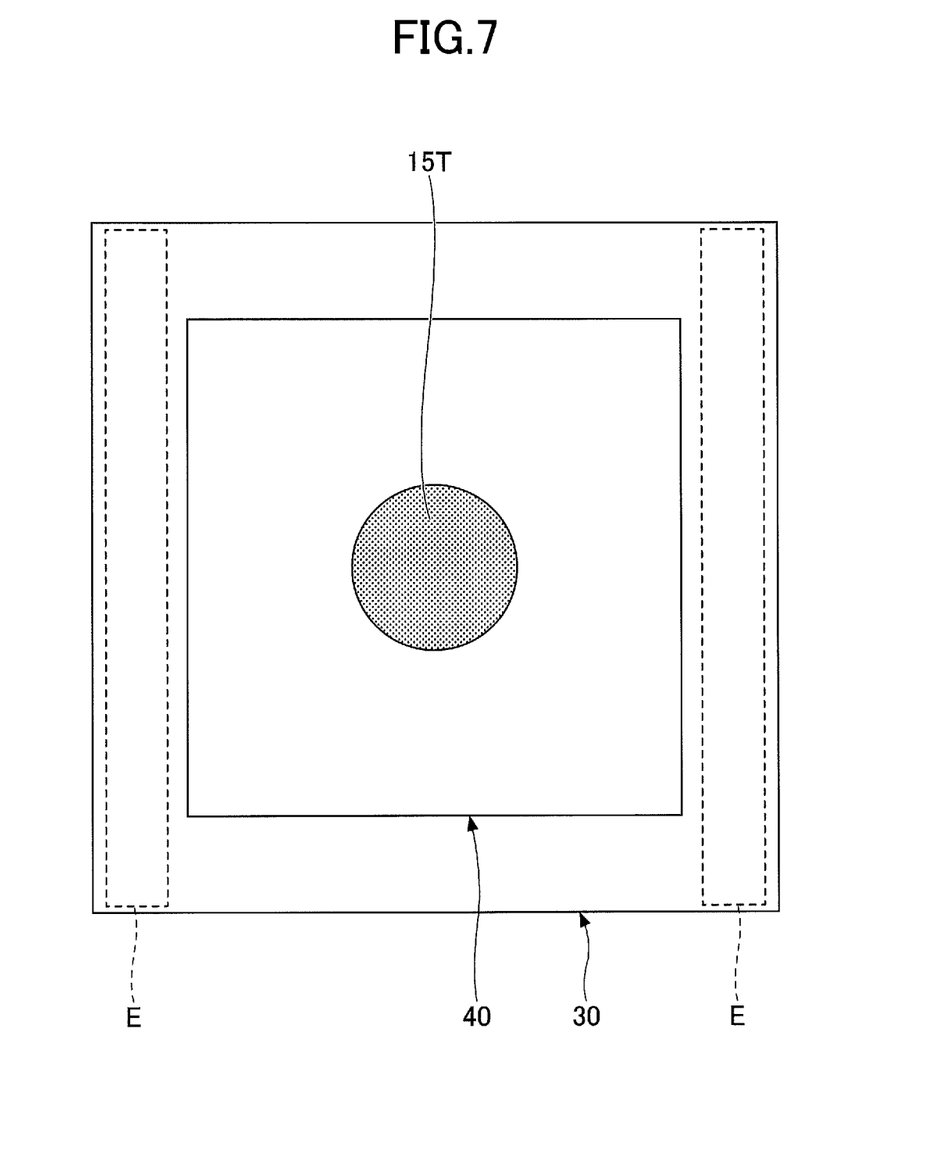
FIG. 7 is a schematic plan view that describes an arrangement of a protruding portion (part 2).

Note that FIG. 7 is a schematic plan view that describes an arrangement of a protruding portion 15T (part 2), and schematically illustrates a partial configuration of the semiconductor package 1. The dimensional relationship of FIG. 7 does not match the dimensional relationship of FIGS. 1A and 1B. Also, in FIG. 7, E indicates areas where the substrate connection members 20 are arranged.

Although an example is illustrated in the first embodiment in which the protruding portions 15T are provided at a plurality of locations on an area of the solder resist layer 15 overlapping the semiconductor chip 40 in plan view (see FIG. 2), at least one protruding portion 15T may be provided. In the example of FIG. 7, a relatively large one protruding portion 15T is provided, on the lower surface 15a of the solder resist layer 15, at a position overlapping the central portion of the semiconductor chip 40 in plan view.

The planar shape of the protruding portions 15T can be a circular shape, for example. For example, when the semiconductor chip 40 has a 12 mm square rectangular shape, the protruding portion 15T having, as a planar shape, a circular shape of a diameter of approximately 5 mm can be arranged at the position of FIG. 7.

A case is assumed in which protruding portions 15T are not provided at all, and at the time of forming the mold resin 70 in the step of FIG. 5B, a pressure is applied from the top and bottom of the structure of FIG. 4B that is filled with the mold resin 70. In this case, in the vicinity of the areas where the substrate connection members 20 are arranged, the structure illustrated in FIG. 4B does not easily deform because the gap is secured by the substrate connection members 20. On the other hand, the central portion of the area, where the lower surface 15a of the solder resist layer 15 and the back surface 40b of the semiconductor chip 40 face each other, which is farthest from the areas where the substrate connection members 20 are disposed, is most likely to deform such that gap is easily narrowed.

Therefore, as illustrated in FIG. 7, the protruding portion 15T is arranged at the central portion of the area, where the lower surface 15a of the solder resist layer 15 and the back surface 40b of the semiconductor chip 40 face each other, which is most likely to be narrowed in the step of FIG. 5B. Thereby, the gap between the lower surface 15a of the solder resist layer 15 and the back surface 40b of the semiconductor chip 40 can be easily secured.

Although a preferable embodiment and its modified example have been described above in detail, the present invention is not limited to the preferable embodiment and its modified example described above, and various variations and substitutions may be made for the preferable embodiment and its modified example described above without departing from the scope of the present invention.

For example, as the substrate 10 and the substrate 30, a build-up substrate in which a larger number of wiring layers and insulating layers are formed or the like may be used. In this case, a coreless build-up substrate or the like may be used.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification re late to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A semiconductor package comprising:
    a first substrate;
    a semiconductor chip mounted on the first substrate such that a circuit formation surface is oriented toward the first substrate;
    a second substrate arranged above the first substrate, the semiconductor chip being sandwiched between the first substrate and the second substrate; and
    a resin that seals the semiconductor chip and that is filled between the first substrate and the second substrate,
    wherein the second substrate includes a solder resist layer having a first surface facing a back surface that is an opposite surface of the circuit formation surface of the semiconductor chip,
    wherein protruding portions present on the first surface of the solder resist layer in cross-section protrude towards the back surface of the semiconductor chip,
    wherein the protruding portions each have an end surface closest to the back surface of the semiconductor chip,
    wherein the solder resist layer and the protruding portions are formed of a same material,
    wherein an area of each of the protruding portions is smaller than an area of back surface of the semiconductor chip in plan view, and
    wherein the back surface of the semiconductor chip is in contact with the resin, such that the resin is present between the back surface of the semiconductor chip and the end surface of each and every one of the protruding portions present on the first surface of the solder resist layer in cross-section.

2. The semiconductor package according to claim 1, wherein the at least one protruding portion is provided at a position overlapping a central portion of the semiconductor chip in plan view.

3. The semiconductor package according to claim 1, wherein on the area, the at least one protruding portion includes a plurality of protruding portions that protrude toward the back surface of the semiconductor chip.

4. The semiconductor package according to claim 3,
    wherein a planar shape of the semiconductor chip is a rectangular shape, and
    wherein the protruding portions are provided at a position overlapping a central portion of the semiconductor chip in plan view and at positions overlapping four corners of the semiconductor chip in plan view.

5. The semiconductor package according to claim 1, further comprising:
    a substrate connection member that is provided between the first substrate and the second substrate and that electrically connects the first substrate and the second substrate.

* * * * *